(12) United States Patent
Cheng et al.

(10) Patent No.: US 11,043,460 B2
(45) Date of Patent: Jun. 22, 2021

(54) MEASUREMENT METHOD OF OVERLAY MARK STRUCTURE

(71) Applicant: UNITED MICROELECTRONICS CORP., Hsin-Chu (TW)

(72) Inventors: Yu-Wei Cheng, Kaohsiung (TW); Bo-Jou Lu, Tainan (TW); Chun-Chi Yu, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/000,365

(22) Filed: Aug. 23, 2020

(65) Prior Publication Data

US 2020/0388577 A1 Dec. 10, 2020

Related U.S. Application Data

(62) Division of application No. 16/243,083, filed on Jan. 9, 2019, now Pat. No. 10,811,362.

(51) Int. Cl.
*H01L 23/544* (2006.01)
*H01L 21/66* (2006.01)

(52) U.S. Cl.
CPC ........... *H01L 23/544* (2013.01); *H01L 22/12* (2013.01); *H01L 2223/5442* (2013.01); *H01L 2223/54426* (2013.01)

(58) Field of Classification Search
None
See application file for complete search history.

(56) References Cited

U.S. PATENT DOCUMENTS

| | | | |
|---|---|---|---|
| 7,427,774 B1 | 9/2008 | Mantz | |
| 9,007,571 B2 | 4/2015 | Tzai | |
| 9,490,217 B1* | 11/2016 | Lin | ...................... G03F 7/70633 |
| 2015/0055125 A1* | 2/2015 | Tzai | ..................... G03F 7/70633 356/72 |
| 2018/0130845 A1* | 5/2018 | Ko | ........................ H01L 23/544 |

* cited by examiner

*Primary Examiner* — Steven M Christopher
(74) *Attorney, Agent, or Firm* — Winston Hsu

(57) ABSTRACT

An overlay mark structure includes a plurality of first patterns of a previous layer and a plurality of second patterns of a current layer. Each of the second patterns includes a first section and a second section. The first section is disposed corresponding to one of the first patterns in a vertical direction. The first section partially overlaps the first pattern corresponding to the first section in the vertical direction. The second section is separated from the first section in an elongation direction of the second pattern. A part of the first pattern corresponding to the first section is disposed between the first section and the second section in the elongation direction of the second pattern. A measurement method of the overlay mark structure includes performing a diffraction-based overlay measurement between each of the first sections and the first pattern overlapping the first section.

11 Claims, 8 Drawing Sheets

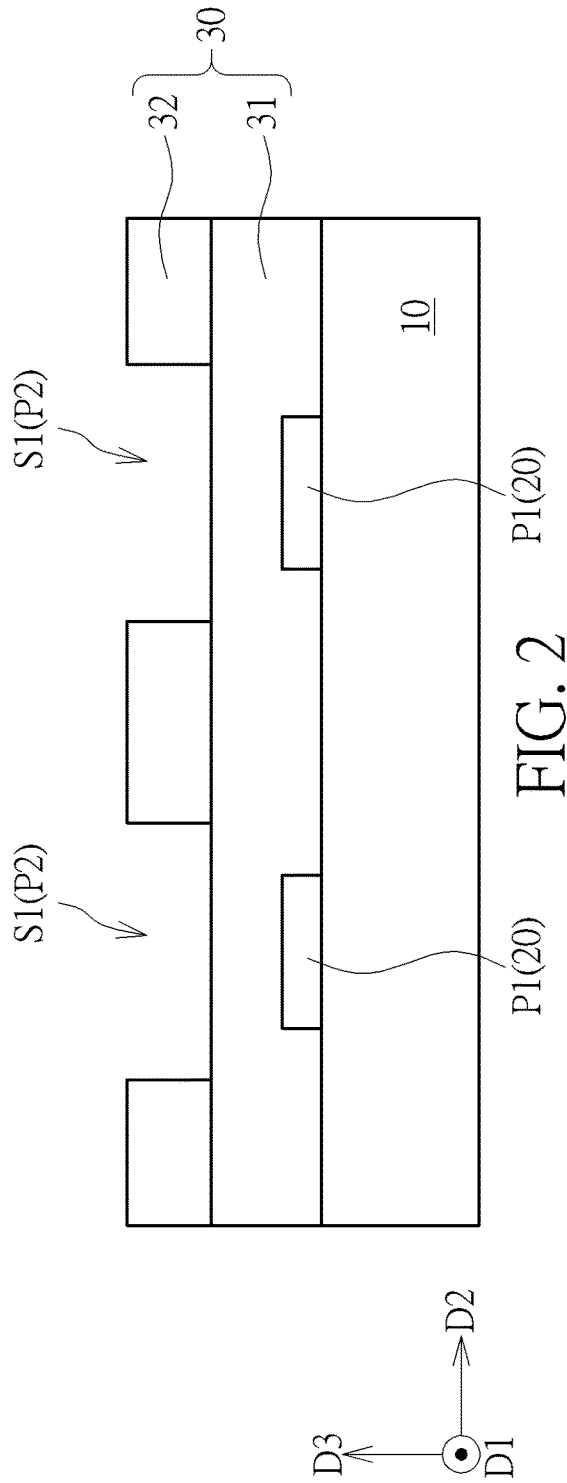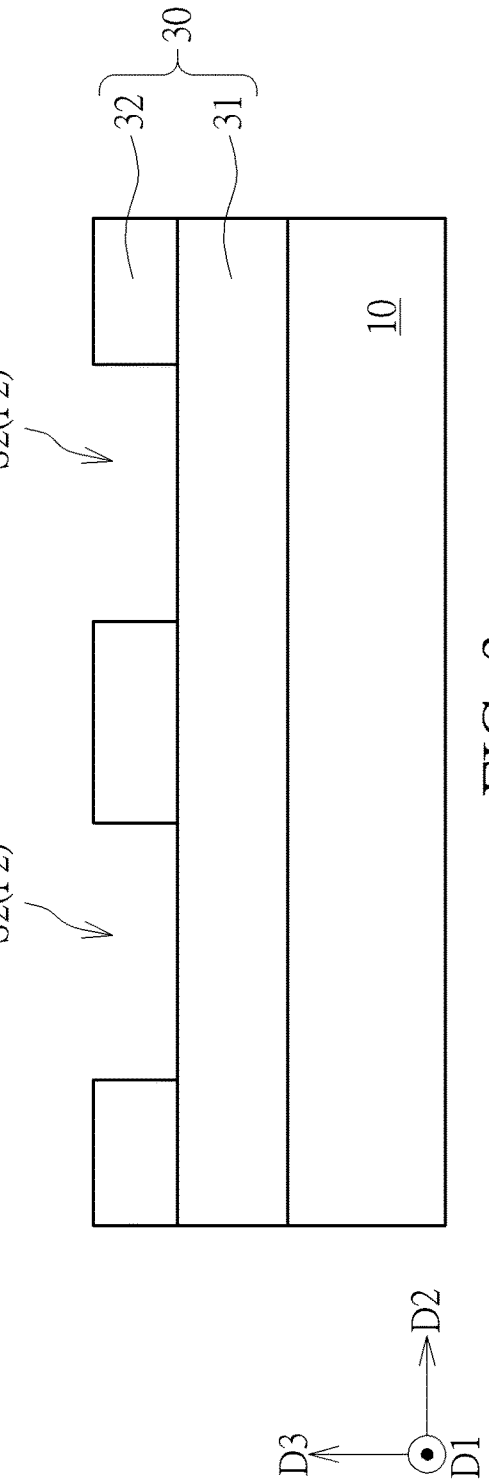

MEASUREMENT METHOD OF OVERLAY MARK STRUCTURE

CROSS REFERENCE TO RELATED APPLICATIONS

This application is a division of application Ser. No. 16/243,083 filed on Jan. 9, 2019, now allowed, which is incorporated by reference herein in its entirety.

BACKGROUND OF THE INVENTION

1. Field of the Invention

The present invention relates to an overlay mark structure and a measurement method thereof, and more particularly, to an overlay mark structure including patterns for different overlay measurements and a measurement method thereof.

2. Description of the Prior Art

The manufacture of integrated circuits keeps improving as the related technologies progress. Many kinds of electric circuits may be integrated and formed on a single chip. The semiconductor process for manufacturing chips may include many steps, such as a deposition process for forming a thin film, a photoresist coating process, an exposure process, and a develop process for forming a patterned photoresist, and an etching process for patterning the thin film. In the exposure process, a photomask having a pattern to be formed has to be aligned with a base layer pattern on a wafer for transferring the pattern to a specific location on the wafer. The alignment condition may be monitored by measuring the relative position between overlay marks of different layers for reducing the influence of process variations on the production yield. However, as the semiconductor process becomes more complicated, different kinds of overlay measurements are required for confirming process results more precisely. The area for product on the wafer may be reduced because different kinds of overlay marks are required to be disposed on the wafer, and the manufacturing cost may increase accordingly.

SUMMARY OF THE INVENTION

An overlay mark structure and a measurement method thereof are provided in the present invention. In the overlay mark structure, a second pattern of a current layer includes a first section partially overlapping a first pattern of a previous layer and a second section separated from the first section for different kinds of overlay measurements. An area for product on a wafer may increase relatively because overlay mark structures for different overlay measurements are integrated for reducing the required area, and the related manufacturing cost may be reduced accordingly.

According to an embodiment of the present invention, an overlay mark structure is provided. The overlay mark structure includes a plurality of first patterns of a previous layer and a plurality of second patterns of a current layer. Each of the second patterns includes a first section and a second section. The first section is disposed corresponding to one of the first patterns in a vertical direction. The first section partially overlaps the first pattern corresponding to the first section in the vertical direction. The second section is separated from the first section in an elongation direction of the second pattern. A part of the first pattern corresponding to the first section is disposed between the first section and the second section in the elongation direction of the second pattern.

According to an embodiment of the present invention, a measurement method of an overlay mark structure is provided. The measurement method includes the following steps. An overlay mark structure is provided first. The overlay mark structure includes a plurality of first patterns of a previous layer and a plurality of second patterns of a current layer. Each of the second patterns includes a first section and a second section. The first section is disposed corresponding to one of the first patterns in a vertical direction. The first section partially overlaps the first pattern corresponding to the first section in the vertical direction. The second section is separated from the first section in an elongation direction of the second pattern. A part of the first pattern corresponding to the first section is disposed between the first section and the second section in the elongation direction of the second pattern. Subsequently, a diffraction-based overlay measurement between each of the first sections and the first pattern overlapping the first section is performed.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is a cross-sectional diagram taken along a line A-A' in FIG. 1.

FIG. 3 is a cross-sectional diagram taken along a line B-B' in FIG. 1.

FIGS. 4-10 are schematic drawings illustrating a measurement method of an overlay mark structure according to an embodiment of the present invention, wherein FIG. 4 is a flow chart of the measurement method of the overlay mark structure, FIG. 5 is a schematic drawing illustrating a measurement region for a diffraction-based overlay measurement, FIG. 6 is a schematic drawing illustrating measurement regions for a first image-based overlay measurement, FIG. 7 is a schematic drawing illustrating measurement regions for a second image-based overlay measurement, FIG. 8 is a schematic drawing illustrating a measurement region for an electrical overlay measurement, FIG. 9 is a partially enlarged drawing of FIG. 8, and FIG. 10 is a cross-sectional diagram taken along a line C-C' in FIG. 9.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the related art that the present invention can also be employed in a variety of other applications.

It should be understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Figure 1:
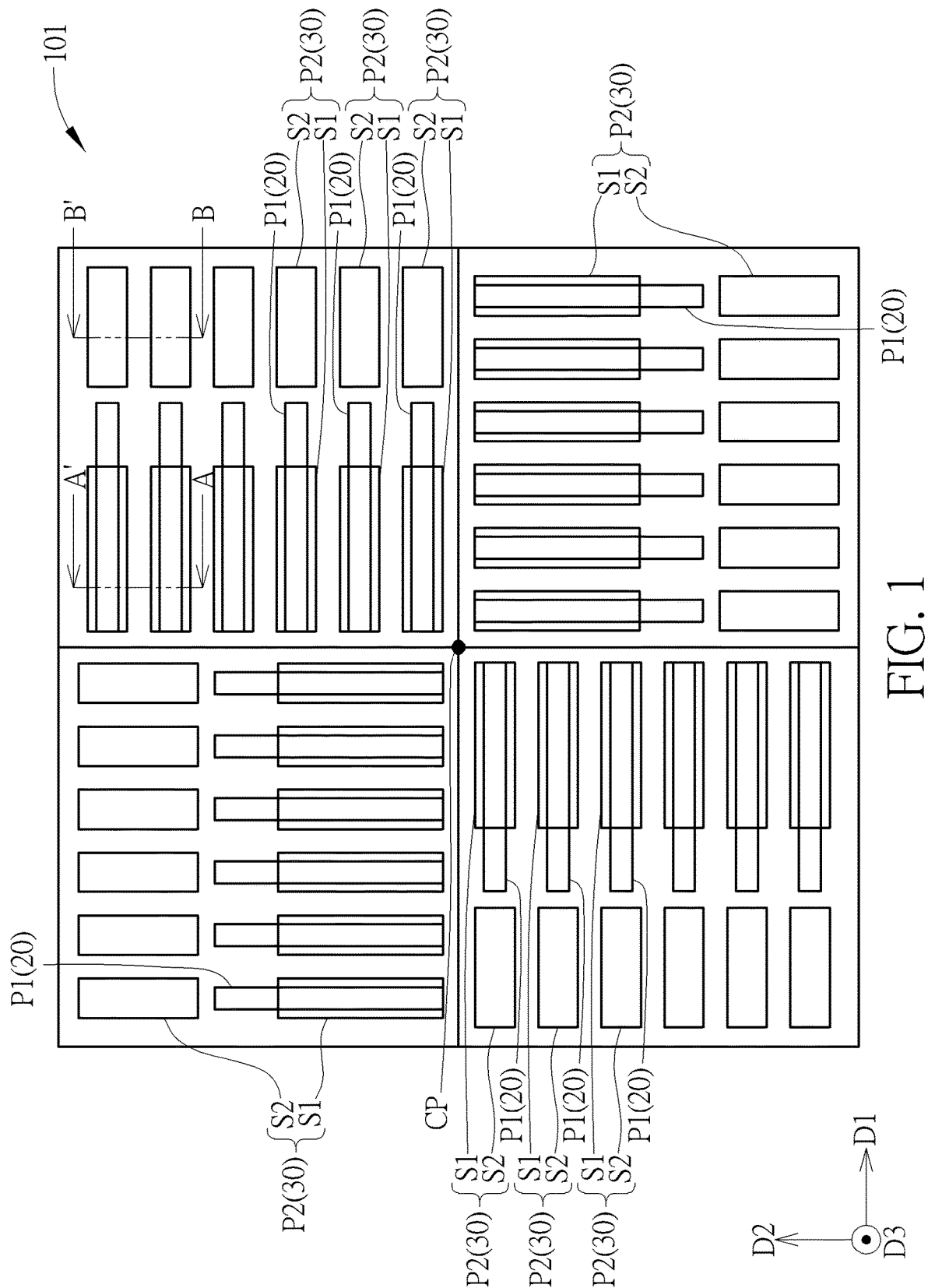
FIG. 1 is a top view schematic drawing illustrating an overlay mark structure according to an embodiment of the present invention.

Please refer to FIGS. 1-3. FIG. 1 is a top view schematic drawing illustrating an overlay mark structure according to an embodiment of the present invention. FIG. 2 is a cross-sectional diagram taken along a line A-A' in FIG. 1. FIG. 3 is a cross-sectional diagram taken along a line B-B' in FIG. 1. As shown in FIGS. 1-3, an overlay mark structure 101 is provided in this embodiment. The overlay mark structure 101 includes a plurality of first patterns P1 of a previous layer 20 and a plurality of second patterns P2 of a current layer 30. In some embodiments, the previous layer 20 may be disposed on a substrate 10, and the current layer 30 may be disposed on the previous layer 20 and the substrate 10. In some embodiments, the substrate 10 may include a semiconductor substrate or a non-semiconductor substrate. The semiconductor substrate mentioned above may include a silicon substrate, an epitaxial silicon substrate, a silicon germanium substrate, a silicon carbide substrate, a silicon-on-insulator (SOI) substrate, or substrates formed by other suitable semiconductor materials. The none-semiconductor substrate mentioned above may include a glass substrate, a ceramic substrate, a plastic substrate, or substrates formed by other suitable non-semiconductor materials. In some embodiments, other required components (not shown), such as active components (e.g. transistors), passive components (e.g. capacitors), conductive lines, contact plugs, or dielectric layers, may be formed on the substrate 10 before the step of forming the previous layer 20. In some embodiments, the previous layer 20 and the current layer 30 may also be used to form components, such as active components, passive components, conductive lines, contact plugs, or dielectric layers. Specifically, in some embodiments, a main region and an overlay mark region may be defined on the substrate 10, the overlay mark structure 101 may be disposed on the overlay mark region, and the previous layer 20 and the current layer 30 may be further disposed on the main region for forming the components described above. Therefore, the material of the previous layer 20 and the material of the current layer 30 may include a conductive material, a semiconductor material, a dielectric material, or other materials required for forming the components described above.

In the overlay mark structure 101, each of the second patterns P2 includes a first section S1 and a second section S2. Each of the first sections S1 is disposed corresponding to one of the first patterns P1 in a vertical direction D3. In some embodiments, the vertical direction D3 may be perpendicular to a plane where the previous layer 20 is disposed. For example, the vertical direction D3 may also be regarded as a thickness direction of the substrate 10, but not limited thereto. In each of the second patterns P2, the first section S1 partially overlaps the first pattern P1 corresponding to the first section S1 in the vertical direction D3, and the second section S2 is separated from the first section S1 in an elongation direction of the second pattern P2 (such as a first direction D1 or a second direction D2 shown in FIGS. 1-3). A part of the first pattern P1 corresponding to the first section S1 is disposed between the first section S1 and the second section S2 in the elongation direction of the second pattern P2.

Specifically, in some embodiments, some of the second patterns P2 may be elongated in the first direction D1, others of the second patterns P2 may be elongated in the second direction D2, and the second direction D2 may be substantially orthogonal to the first direction D1. Each of the first patterns P1 and the second pattern P2 corresponding to this first pattern P1 may be elongated in the same direction. Therefore, some of the first patterns P1 may be elongated in the first direction D1, and others of the first patterns P1 may be elongated in the second direction D2. In the overlay mark structure 101, the first patterns P1 may be substantially arranged symmetrical with respect to a central point CP, and the second patterns P2 may be substantially arranged symmetrical with respect to the central point CP also. By such substantially symmetrical design, the overlay mark structure 101 may be used to measure the alignment accuracy between the previous layer 20 and the current layer 30 with an optical measurement tool, such as a KLA optical measurement tool, or other suitable types of measurement tools.

As shown in FIGS. 1-3, the first section S1 and the second section S2 of the same second pattern P2 are elongated in the same direction (e.g. the first direction D1 or the second direction D2). In each of the second patterns P2, the first section S1 partially overlaps the first pattern P1 corresponding to the first section S1 in the vertical direction D3, and the second section S2 is physically separated from the first section S1 in the elongation direction of the second pattern P2. A part of the first pattern P1 corresponding to the first section S1 is disposed between the first section S1 and the second section S2 in the elongation direction of the second pattern P2, and the part of the first pattern P1 disposed between the second section S2 and the first section S1 within the same second pattern P2 does not overlap the first section S1 in the vertical direction D3. In other words, a part of each of the first patterns P1 is not covered by the second patterns P2 in the vertical direction D3, and the part of each of the first patterns P1 that is not covered by the second patterns P2 is disposed between the first section S1 and the second section S2 of one of the second patterns P2 corresponding to this first pattern P1 in the elongation direction of the second pattern P2. In each of the first patterns P1, a first part of the first pattern P1 is covered by the first section S1 corresponding to the first pattern P1 in the vertical direction D3, a second part of the first pattern P1 is not covered by the first section S1 and the second section S2 in the vertical direction D3, and the first part and second part of the first pattern P1 may be directly connected with each other.

In some embodiments, a width of each of the first sections S1 may be larger than a width of each of the first patterns P1. The width of each of the first sections S1 may be a length of the first section S1 in a direction perpendicular to the elongation direction of the first section S1. The width of each of the first patterns P1 may be a length of the first pattern P1 in a direction perpendicular to the elongation direction of the first pattern P1. In some embodiments, a width of each of the second sections S2 may be substantially equal to the width of each of the first sections S1, but not limited thereto. In some embodiments, the width of each of the second sections S2 may be different from the width of each of the first sections S1. The width of each of the second sections S2 may be a length of the second section S2 in a direction perpendicular to the elongation direction of the second section S2. In some embodiments, a length of each of the first patterns P1 in the elongation direction of the first pattern P1 may be larger than a length of each of the first sections S1 in the elongation direction of the first section S1, but not limited thereto.

In some embodiments, each of the first patterns P1 may be a line pattern, and each of the first sections S1 and each of the second sections S2 may be concave patterns. For example, in some embodiments, the current layer 30 may include a material layer 31 and a mask layer 32 disposed on the material layer 31. The material layer 31 may cover the first patterns P1 and the substrate 10, and the each of the first sections S1 and each of the second sections S2 may be openings penetrating the mask layer 32 in the vertical direction and exposing a part of the material layer 31 respectively. In some embodiments, each of the first patterns P1 may be composed of a plurality of segments (not shown), and each of the segments may be elongated in a direction perpendicular to the elongation direction of the first pattern P1. In some embodiments, the material layer 31 may include a dielectric layer, a conductive layer, a semiconductor layer, or a layer made of other kinds of materials, and the mask layer 32 may be a patterned photoresist layer. The patterned photoresist layer may be formed by a photolithography process including a photoresist coating step, an exposure step, and a development step. Therefore, the overlay mark structure 101 may be regarded as an overlap mark in an after development inspection (ADI) condition, but not limited thereto.

Figure 4:
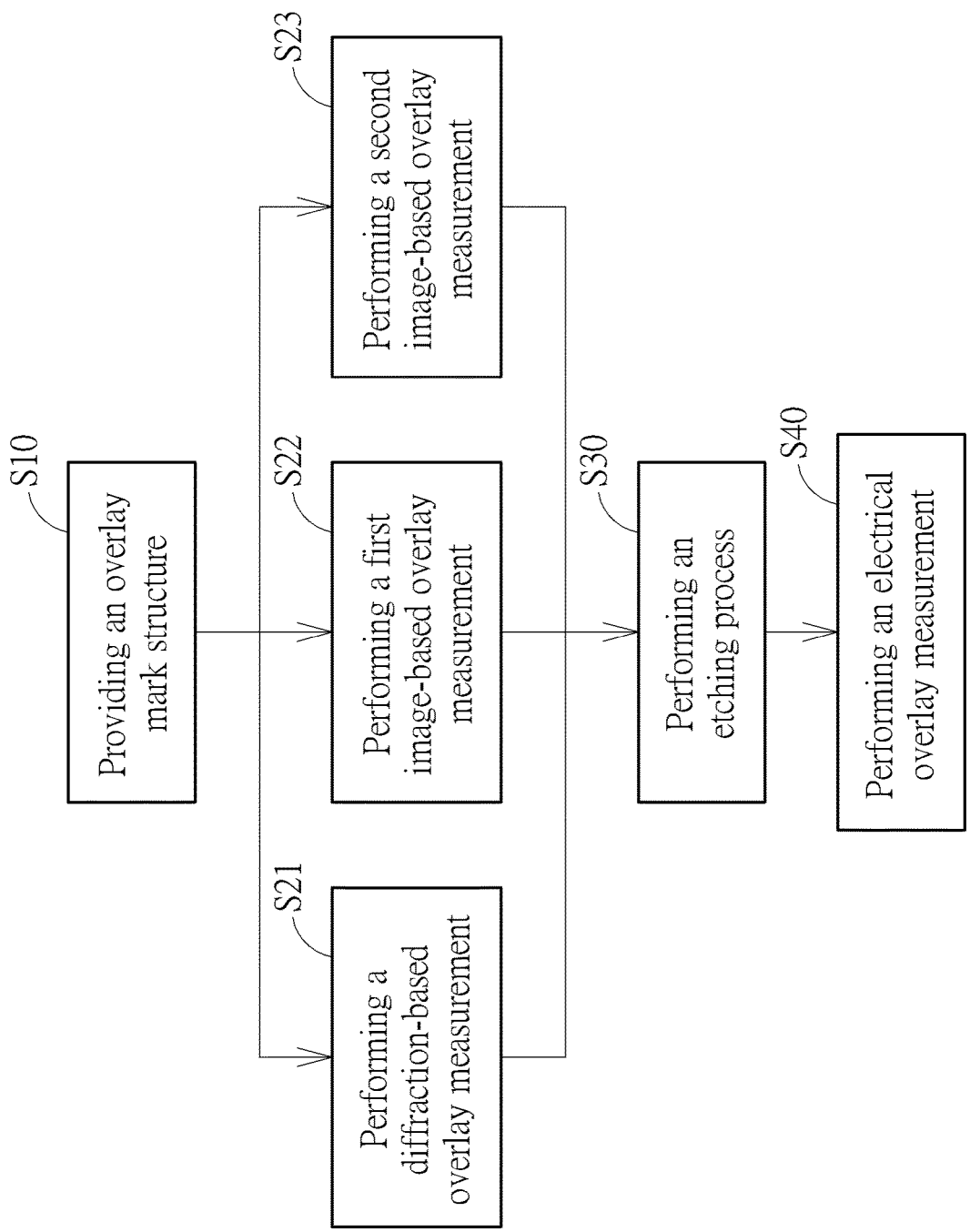
Figure 5:
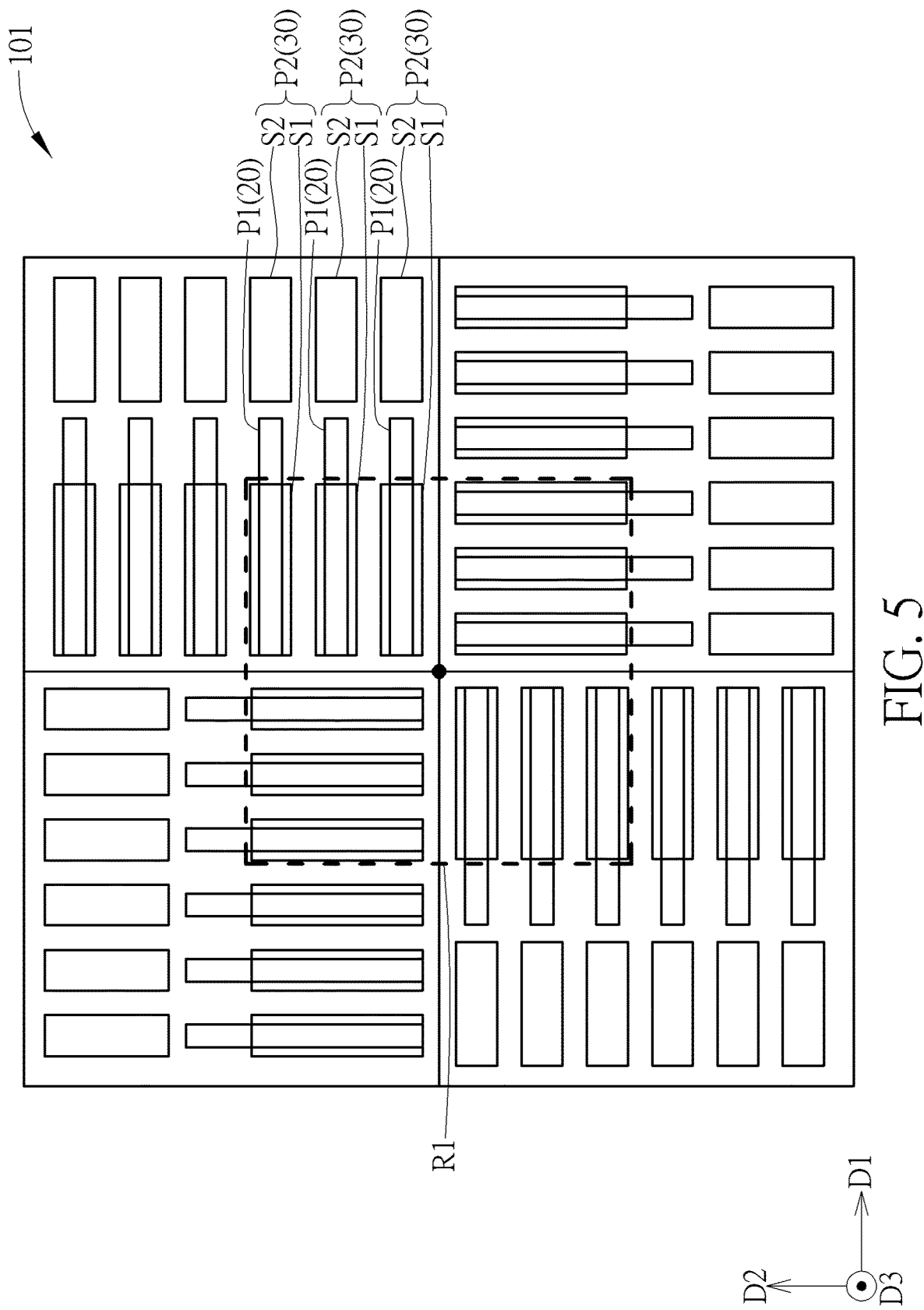
Figure 6:
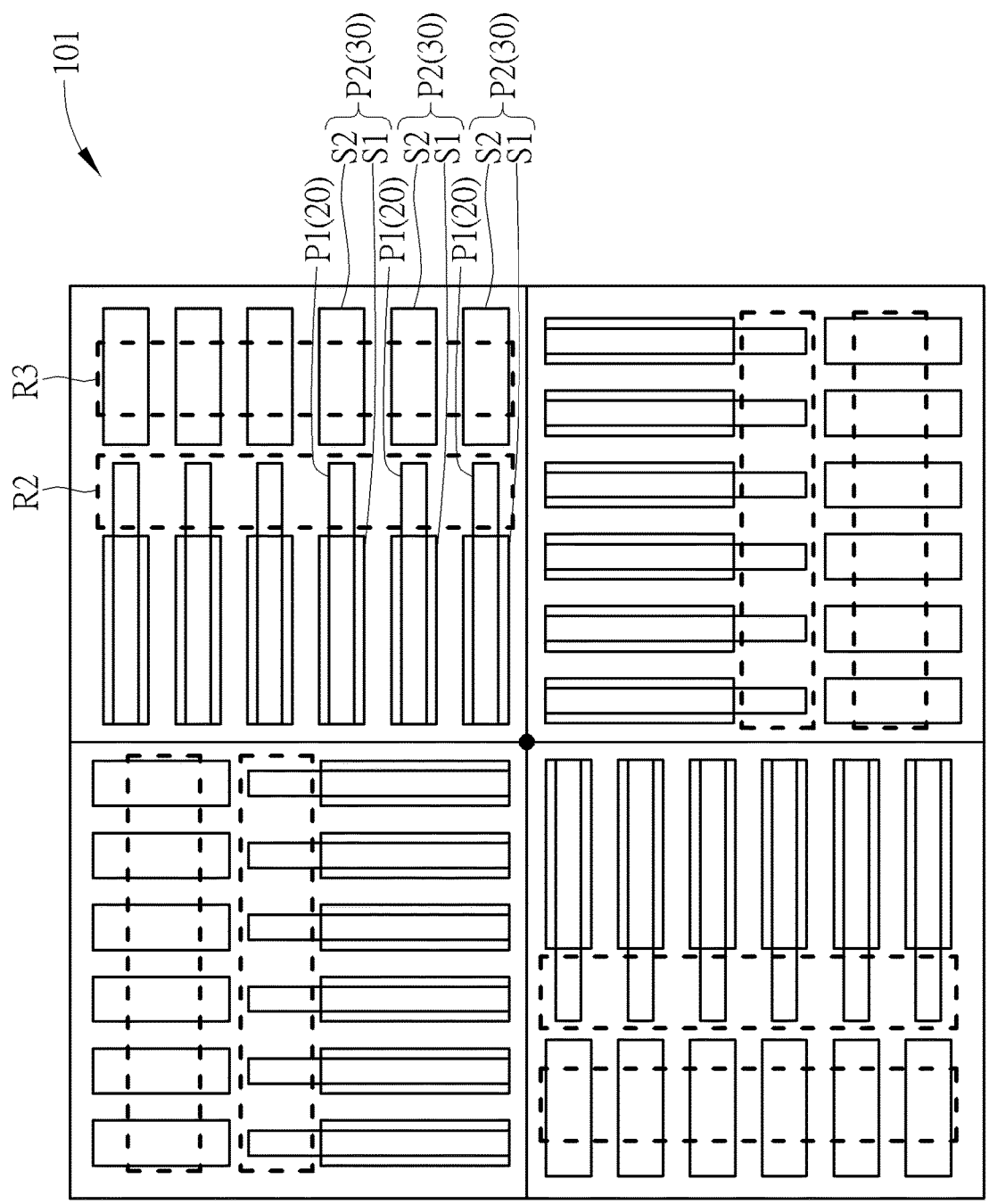
Figure 7:
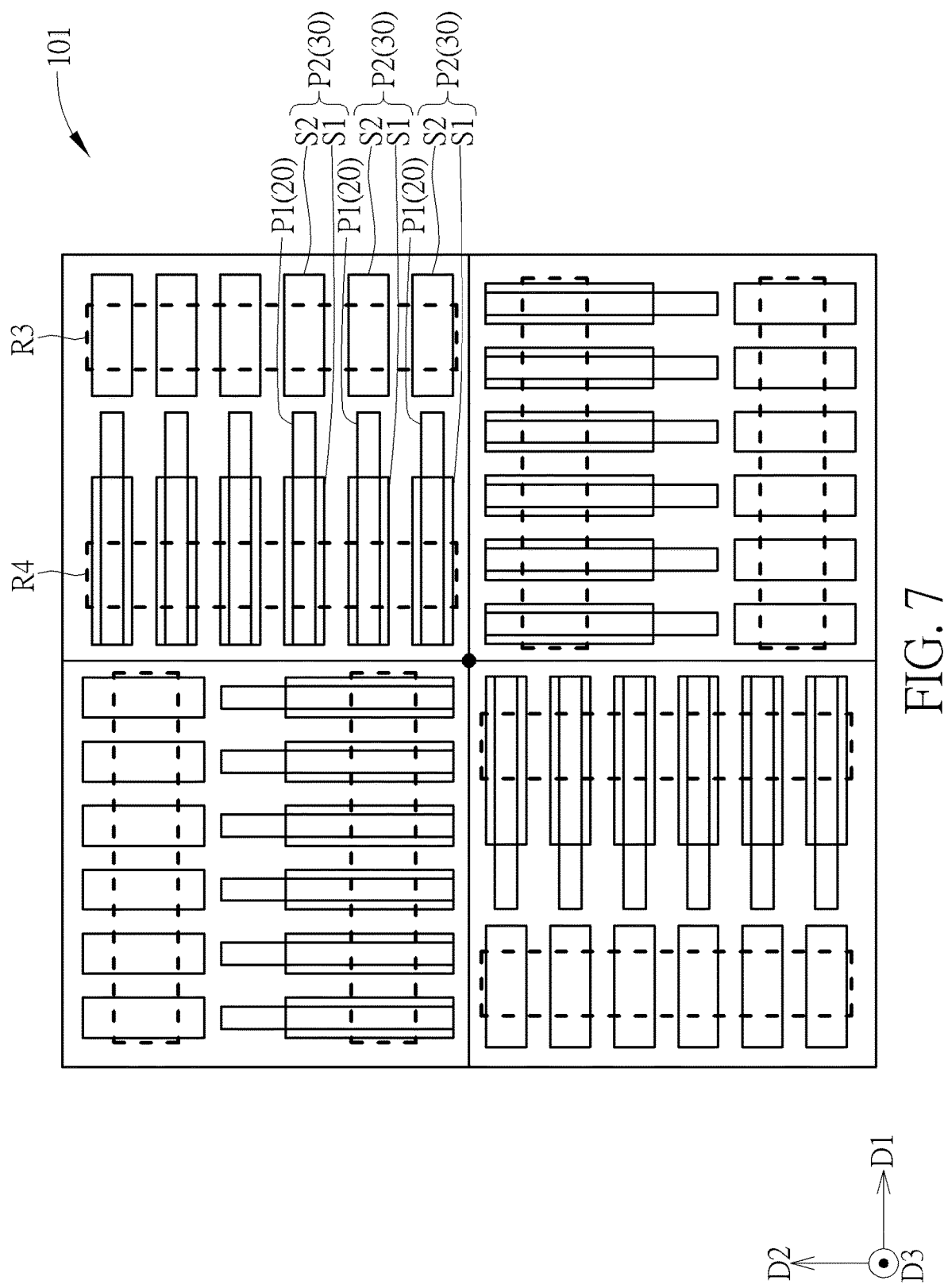
Figure 8:
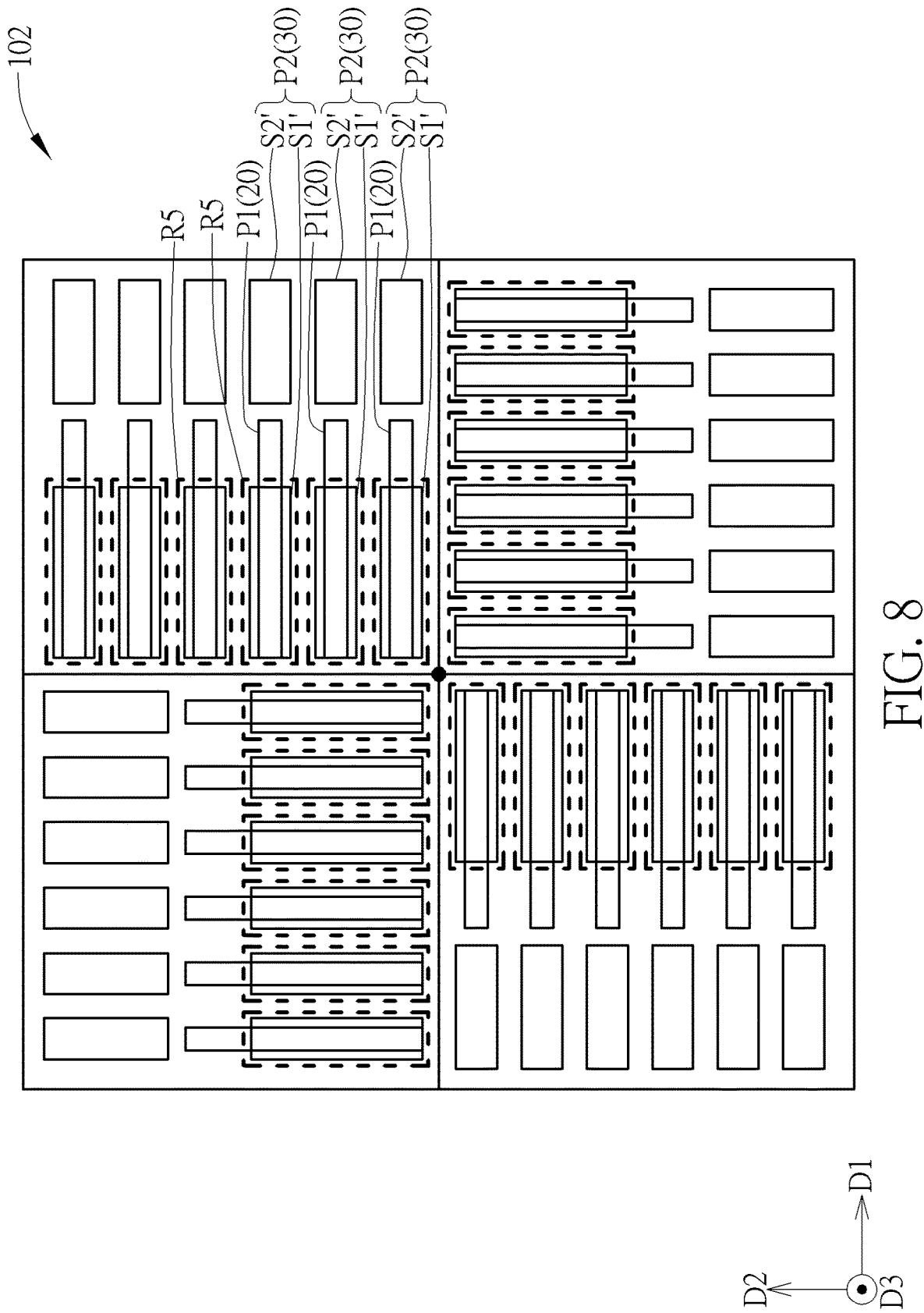
Figure 9:
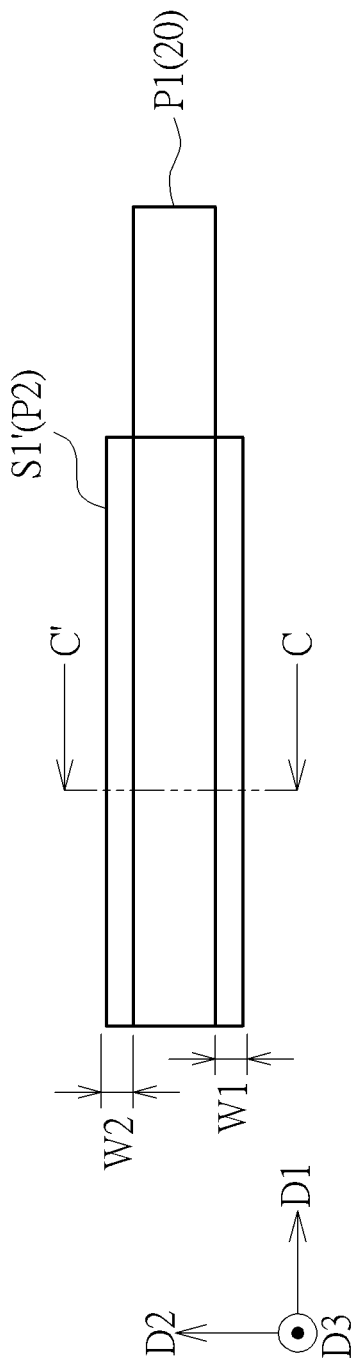
Figure 10:
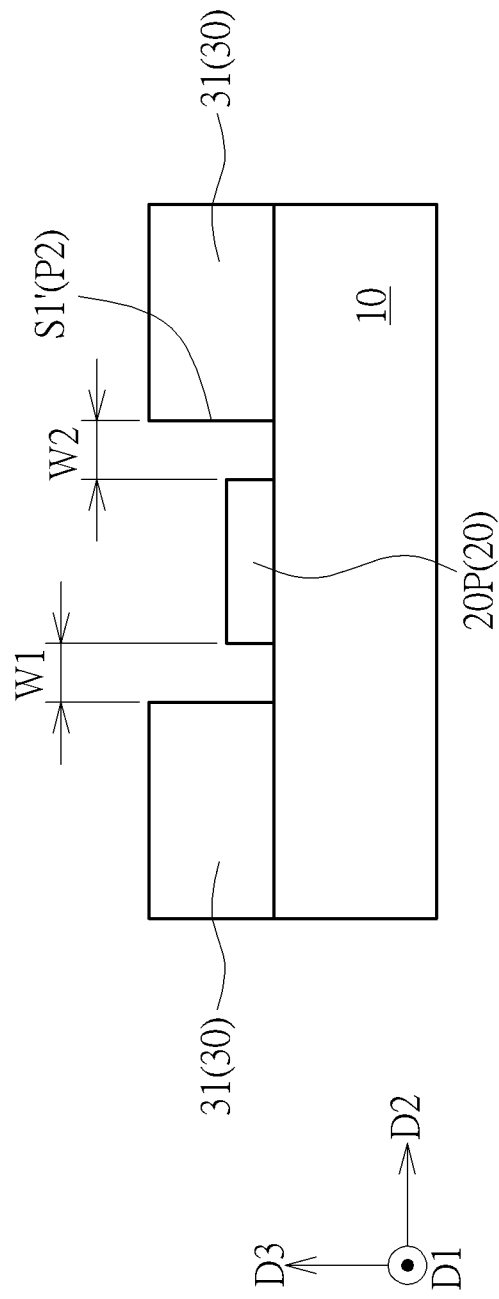

Please refer to FIGS. 4-10 and FIGS. 1-3. FIGS. 4-10 are schematic drawings illustrating a measurement method of an overlay mark structure according to an embodiment of the present invention. FIG. 4 is a flow chart of the measurement method of the overlay mark structure, FIG. 5 is a schematic drawing illustrating a measurement region for a diffraction-based overlay measurement, FIG. 6 is a schematic drawing illustrating measurement regions for a first image-based overlay measurement, FIG. 7 is a schematic drawing illustrating measurement regions for a second image-based overlay measurement, FIG. 8 is a schematic drawing illustrating a measurement region for an electrical overlay measurement, FIG. 9 is a partially enlarged drawing of FIG. 8, and FIG. 10 is a cross-sectional diagram taken along a line C-C' in FIG. 9. The measurement method of the overlay mark structure in this embodiment may include the following step. As shown in FIG. 4 and FIGS. 1-3, in step S10, the overlay mark structure 101 is provided. As shown in FIG. 4, FIG. 5, and FIGS. 1-3, in step S21, a diffraction-based overlay (DBO) measurement may be performed. The diffraction-based overlay measurement may be used to measure the overlay condition between each of the first sections S1 and the first pattern P1 overlapping the first section S1. For example, a diffraction-based overlay measurement between each of the first sections S1 and the first pattern P1 overlapping the first section S1 may be performed at a first measurement region R1 shown in FIG. 5, but not limited thereto. In the diffraction-based overlay measurement, the alignment condition between the pattern center of each of the first sections S1 in the direction perpendicular to the elongation direction of this first section S1 and the pattern center of each of the corresponding first pattern P1 in the direction perpendicular to the elongation direction of this first pattern P1 may be measured and calculated for confirming the alignment accuracy between the previous layer 20 and the current layer 30

As shown in FIG. 4, FIG. 6, and FIGS. 1-3, in step S22, a first image-based overlay (IBO) measurement may be performed. The first image-based overlay measurement may be used to measure the overlay condition between each of the second sections S2 and the part of the first pattern P1 disposed between the second section S2 and the first section S1 within the same second pattern P2. For example, the first image-based overlay measurement between each of the second sections S2 and the part of the first pattern P1 disposed between the second section S2 and the first section S1 within the same second pattern P2 may be performed at a plurality of second measurement regions R2 and a plurality of third measurement regions R3 shown in FIG. 6, but not limited thereto. In the first image-based overlay measurement, the alignment condition between the pattern center of each of the second sections S2 in the direction perpendicular to the elongation direction of this second section S2 and the pattern center of each of the corresponding first pattern P1 in the direction perpendicular to the elongation direction of this first pattern P1 may be measured and calculated for further confirming the alignment accuracy between the previous layer 20 and the current layer 30.

As shown in FIG. 4, FIG. 7, and FIGS. 1-3, in step S23, a second image-based overlay measurement may be performed. The second image-based overlay measurement may be used to measure the overlay condition between the first section S1 and the second section S2 of each of the second patterns P2 in the elongation direction of the second pattern P2. For example, the second image-based overlay measurement between the first section S1 and the second section S2 of each of the second patterns P2 in the elongation direction of the second pattern P2 may be performed at a plurality of fourth measurement regions R4 and the third measurement regions R3 shown in FIG. 7, but not limited thereto. In the second image-based overlay measurement, the alignment condition between the pattern center of each of the second sections S2 in the direction perpendicular to the elongation direction of the second section S2 and the pattern center of the corresponding first section S1 in the direction perpendicular to the elongation direction of this first section S1 may be measured and calculated for confirming the influence of the previous layer 20 on the shape of the second patterns P2. Therefore, the second image-based overlay measurement may include a self-calibration measurement for the second patterns P2. In some embodiment, another overlay mark (not shown) consisted of the first sections S1 and the second sections S2 without the first patterns P1 may be disposed on the substrate 10 for a self-calibration measurement only, but not limited thereto.

In some embodiments, the first image-based overlay measurement and the diffraction-based overlay measurement may be performed to further confirm the alignment accuracy between the previous layer 20 and the current layer 30. The second image-based overlay measurement may be used to check that if the first image-based overlay measurement and/or the diffraction-based overlay measurement is influenced by a previous layer issue or not. In some embodiments, when the measurement result of the first image-based overlay measurement is quite different from the measurement result of the diffraction-based overlay measurement, the second image-based overlay measurement may be used to confirm that if there is a measurement error in the diffraction-based overlay measurement. Additionally, the diffraction-based overlay measurement, the first image-based overlay measurement, and the second image-based overlay measurement may be performed to the overlay mark structure 101, which is an overlap mark in the ADI condition, but not limited thereto. In some embodiments, at least one of the diffraction-based overlay measurement or the first image-based overlay measurement has to be performed for confirming the alignment accuracy between the previous layer 20 and the current layer 30, and the second image-based overlay measurement may be performed optionally when the diffraction-based overlay measurement is performed to the overlay mark structure 101.

As shown in FIG. 4, FIGS. 8-10, and FIGS. 1-3, in step S30, an etching process may be performed after the diffraction-based overlay measurement, the first image-based overlay measurement, and/or the second image-based overlay measurement. The etching process may be performed to the material layer 31 with the mask layer 32 as an etching mask for transferring the second patterns P2 into the material layer 31. After performing the etching process to the overlay mark structure 101 shown in FIGS. 1-3, the mask layer 32 may be removed, and an overlay mark structure 102 shown in FIGS. 8-10 may be obtained. Therefore, the overlay mark structure 102 may be regarded as an overlap mark in an after etching inspection (AEI) condition, but not limited thereto. The first section S1 and the second section S2 of each of the second patterns P2 may be transferred to the material layer 31. The material layer 31 may include a plurality of first sections S1' and a plurality of second section S2'. The first sections S1' are formed corresponding to the first section S1, and the second sections S2' are formed corresponding to the second sections S2.

Subsequently, in step S40, an electrical overlay measurement may be performed. The electrical overlay measurement may be used to measure the overlay condition between each of the first sections S1' in the material layer 31 and the first pattern P1 overlapping the first section S1' after the etching process. The mask layer 32 may be removed after the etching process and before the electrical overlay measurement. In some embodiments, the electrical overlay measurement between each of the first sections S1' in the material layer 31 and the first pattern P1 overlapping the first section S1' may be performed at a plurality of fifth measurement regions R5 shown in FIG. 8, but not limited thereto. In some embodiments, the electrical overlay measurement may include critical dimension scanning electron microscopy (CD-SEM), transmission electron microscopy (TEM), atomic force microscopy (AFM), or other suitable electrical overlay measurement approaches. As shown in FIG. 4 and FIGS. 8-10, in the electrical overlay measurement, the alignment condition between each of the first sections S1' of the current layer 30 and the corresponding first pattern P1 of the previous layer 20 may be measured and calculated for confirming the alignment accuracy between the previous layer 20 and the current layer 30 under the AEI condition. For example, a first distance W1 between one sidewall of the first section S1' and the corresponding first pattern P1 in the direction perpendicular to the elongation direction of the first pattern P1 and a second distance W2 between another sidewall of the first section S1' and the corresponding first pattern P1 in the direction perpendicular to the elongation direction of the first pattern P1 may be measured by the electrical overlay measurement, and the overlay value may be a half of the difference between the first distance W1 and the second distance W2, but not limited thereto To summarize the above descriptions, in the overlay mark structure and the measurement method thereof according to the present invention, the second pattern of the current layer includes the first section partially overlapping the first pattern of the previous layer and the second section physically separated from the first section for different kinds of overlay measurements. In the present invention, the overlay mark patterns for different kinds of overlay measurements are integrated in one overlay mark structure for reducing the required area, and the area for product on a wafer may increase relatively. The alignment accuracy may be confirmed more precisely, and the related manufacturing cost may be reduced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A measurement method of an overlay mark structure, comprising:
    providing an overlay mark structure, the overlay mark structure comprising:
        a plurality of first patterns of a previous layer; and
        a plurality of second patterns of a current layer, wherein each of the second patterns comprises:
            a first section disposed corresponding to one of the first patterns in a vertical direction, wherein the first section partially overlaps the first pattern corresponding to the first section in the vertical direction; and
            a second section separate from the first section in an elongation direction of the second pattern, wherein a part of the first pattern corresponding to the first section is disposed between the first section and the second section in the elongation direction of the second pattern, and the overlay mark structure of the second pattern in the first section is not directly connected to the overlay mark structure of the second pattern in the second section, wherein the longest section of the plurality of the first patterns is in the same direction as the longest section of the plurality of the second patterns; and
    performing a diffraction-based overlay measurement between each of the first sections and the first pattern overlapping the first section.

2. The measurement method of the overlay mark structure according to claim 1, further comprising:
    performing a first image-based overlay measurement between each of the second sections and the part of the first pattern disposed between the second section and the first section within the same second pattern.

3. The measurement method of the overlay mark structure according to claim 1, further comprising:
    performing a second image-based overlay measurement between the first section and the second section of each of the second patterns in the elongation direction of the second pattern.

4. The measurement method of the overlay mark structure according to claim 3, wherein the second image-based overlay measurement comprises a self-calibration measurement.

5. The measurement method of the overlay mark structure according to claim 1, wherein the current layer comprises:
    a material layer; and
    a mask layer disposed on the material layer, wherein each of the first sections and each of the second sections are openings penetrating the mask layer and exposing a part of the material layer.

6. The measurement method of the overlay mark structure according to claim 5, further comprising:
    performing an etching process to the material layer with the mask layer as an etching mask for transferring the second patterns into the material layer; and
    performing an electrical overlay measurement between each of the first sections in the material layer and the first pattern overlapping the first section after the etching process.

7. The measurement method of the overlay mark structure according to claim 6, wherein the mask layer is removed after the etching process and before the electrical overlay measurement.

8. The measurement method of the overlay mark structure according to claim 6, wherein the electrical overlay measurement comprises critical dimension scanning electron microscopy (CD-SEM), transmission electron microscopy (TEM), or atomic force microscopy (AFM).

9. The measurement method of the overlay mark structure according to claim 6, wherein the diffraction-based overlay measurement is performed before the etching process.

10. The measurement method of the overlay mark structure according to claim 1, wherein the part of the first pattern disposed between the second section and the first section within the same second pattern does not overlap the first section in the vertical direction.

11. The measurement method of the overlay mark structure according to claim 1, wherein each of the first patterns is a line pattern, and each of the first sections and each of the second sections are trenches.

\* \* \* \* \*